US012027226B2

(12) United States Patent
Gopinath et al.

(10) Patent No.: US 12,027,226 B2
(45) Date of Patent: Jul. 2, 2024

(54) STRUCTURE INCLUDING A CROSS-BAR ROUTER AND METHOD

(71) Applicant: GlobalFoundries U.S. Inc., Malta, NY (US)

(72) Inventors: Venkatesh P. Gopinath, Fremont, CA (US); Navneet K. Jain, Milpitas, CA (US); Sven Beyer, Dresden (DE)

(73) Assignee: GlobalFoundries U.S. Inc., Malta, NY (US)

(*) Notice: Subject to any disclaimer, the term of this patent is extended or adjusted under 35 U.S.C. 154(b) by 142 days.

(21) Appl. No.: 17/810,018

(22) Filed: Jun. 30, 2022

(65) Prior Publication Data
US 2024/0005963 A1 Jan. 4, 2024

(51) Int. Cl.
*G11C 16/04* (2006.01)
*G11C 5/06* (2006.01)
*G11C 11/22* (2006.01)
*G11C 13/00* (2006.01)

(52) U.S. Cl.
CPC ............ *G11C 5/063* (2013.01); *G11C 11/22* (2013.01); *G11C 13/0028* (2013.01); *G11C 13/0069* (2013.01)

(58) Field of Classification Search
CPC ..... G11C 5/063; G11C 11/22; G11C 13/0028; G11C 13/0069
See application file for complete search history.

(56) References Cited

U.S. PATENT DOCUMENTS

| 8,023,334 B2* | 9/2011 | Hoei | G11C 11/5628 365/194 |
| 9,312,015 B1* | 4/2016 | Hsiung | G11C 8/08 |
| 11,742,025 B2* | 8/2023 | Lue | G11C 16/24 365/185.18 |

OTHER PUBLICATIONS

Breyer et al., "Compact FeFET Circuit Building Blocks for Fast and Efficient Nonvolatile Logic-in-Memory," Journal of the Electron Devices Society, vol. 8, 2020, pp. 748-756.

(Continued)

*Primary Examiner* — Pho M Luu
(74) *Attorney, Agent, or Firm* — David Cain; Hoffman Warnick LLC

(57) ABSTRACT

The structure includes transistors in rows and columns and each having an electric field-based programmable threshold voltage at either a first threshold voltage (VT) or a second VT. The structure further includes first and second signal lines for the rows and columns, respectively. Each first signal line is connected to transistors in a row and each second signal line is connected to transistors in a column. When operated in a switch mode, the transistors may or may not become conductive depending upon their respective VTs. Conductive transistors form connected pairs of first and second signal lines and, thus, create signal paths. The structure can also include mode control circuitry to selectively operate the transistors in either a program mode to set a first VT or an erase mode to set a second VT and to concurrently operate the transistors in the switch mode.

20 Claims, 14 Drawing Sheets

(56) References Cited

OTHER PUBLICATIONS

Chen et al., "Power and Area Efficient FPGA Building Blocks Based on Ferroelectric FETs," IEEE Transactions on Circuits and Systems—I: Regular Papers, vol. 66, No. 5, 2019, pp. 1780-1793.
Miyamura et al., "First Demonstration of Logic Mapping on Non-volatile Programmable Cell Using Complementary Atom Switch," IEDM, 2012, pp. 247-250.
Tada et al., "Improved Reliability and Switching Performance of Atom Switch by Using Ternary Cu-alloy and RuTa Electrodes," IEEE, 2012, pp. 693-696.

* cited by examiner

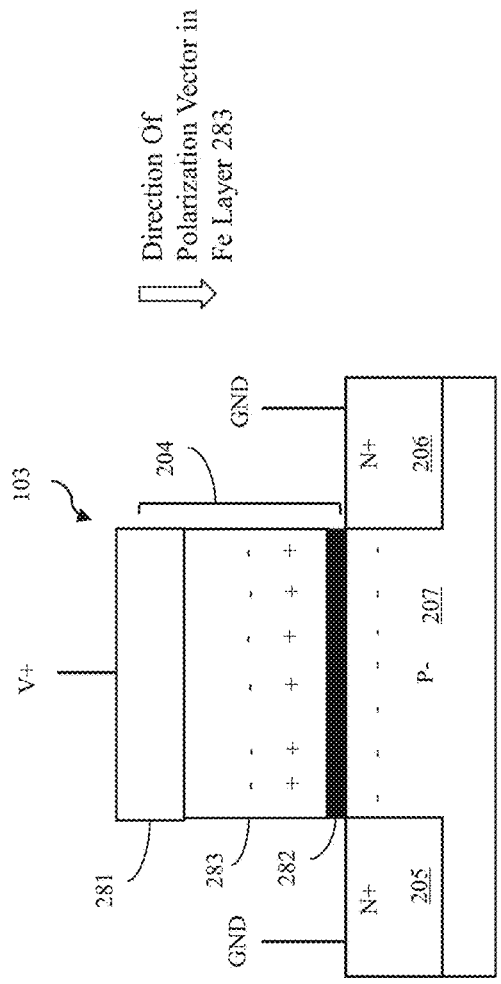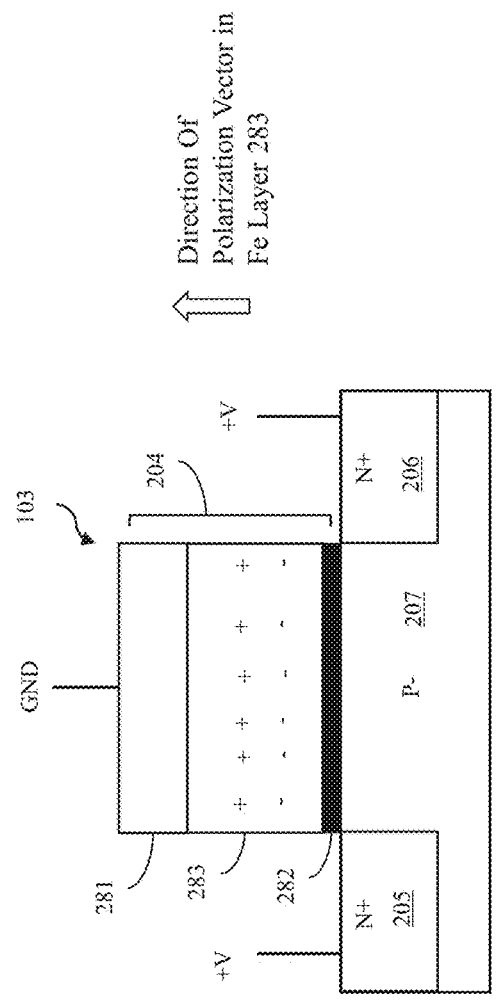

N-type CTFET-Program Mode (Low VT Write) Operation

N-type CTFET-Erase Mode (High VT Write) Operation

Program Mode (Low VT Write) Or Erase Mode (High VT Write) Conditions For A Selected FeFET In A Specific Row And Specific Column

| | GVL For Column Of Selected FeFET | WL For Row Of Selected FeFET | Gate Node Of Selected FeFET | SL1 For Row Of Selected FeFET | SL2 For Column Of Selected FeFET | En/Din/Dout For TS1 On GVL Of Column Of Selected FeFET | En/Din/Dout For TS2 On SL2 Of Column Of Selected FeFET | En/Din/Dout For TS3 On WL Of Row Of Selected FeFET | En/Din/Dout TS4 On SL1 Of Row Of Selected FeFET |
|---|---|---|---|---|---|---|---|---|---|
| Program (Low VT) | Vp | Vp+Vth | Vp | Gnd | Gnd | high/low/high= Vp | high/high/low= Gnd | High/low/high= Vp+Vth | high/high/low= Gnd |
| Erase (High VT) | Gnd | Vp+Vth* (or at least Vth) | Gnd | Ve | Ve | high/high/low= Gnd | high/low/high= Ve | high/low/high= Vp+Vth or at least Vth Of Access Transistor | high/low/high= Ve |

FIG. 5A

Additional Conditions, During Program Mode Or Erase Mode Of A Selected FeFET, To Prevent VT Switching In Unselected FeFETs In Same Column But Different Rows

| | GVL For Same Column | WLs For Other Rows | Gate Nodes Of FeFETs In Same Column | SL1s Of Other Rows | SL2 For Same Column | En/Din/Dout For TSI1 On GVL For Same Column | En/Din/Dout For TSI2 On SL2 For Same Column | En/Din/Dout For TSI3s On WLs Of Other Rows | En/Din/Dout For TSI4s On SL1s Of Other Rows |
|---|---|---|---|---|---|---|---|---|---|
| Program (Low VT) | Vp | HiZ | Flt | HiZ | Gnd | high/low/high=Vp | high/high/low=Gnd | low/low/HiZ | low/high or low/HiZ |
| Erase (High VT) | Gnd | HiZ | Flt | HiZ | Ve | high/high/low=Gnd | high/low/high=Ve | low/low/HiZ | low/high or low/HiZ |

FIG. 5B

Additional Conditions, During Program Mode Or Erase Mode Of A Selected FeFET, To Prevent VT Switching In Unselected FeFETs In Same Row But Different Columns

| | GVLs For Other Columns | WL For Same Row | Gate Nodes Of FeFets In Same Row | SL1 For Same Row | SL2s For Other Columns | En/Din/Dout For TSI1s On GVLs For Other Columns | En/Din/Dout For TSI2s On SL2s For Other Columns | En/Din/Dout For TSI3 On WL For Same Row | En/Din/Ve/Dout TSI4 On SL1 For Same Row |
|---|---|---|---|---|---|---|---|---|---|
| Program (Low VT) | HiZ | Vp+Vth | Flt | Gnd | HiZ | low/low or high/HiZ | low/low or high/HiZ | high/low/high= Vp+Vth | high/high/low= Gnd |
| Erase (High VT) | HiZ | Vp+Vth* (0+Vth) | Flt | Ve | HiZ | low/low or high/HiZ | low/low or high/HiZ | high/low/high= Vp+Vth or at least Vt | high/low/high= Ve |

FIG. 5C

Additional Conditions, During Program Mode Or Erase Mode Of A Selected FeFET, To Prevent VT Switching In Unselected FeFETs In Different Rows And Different Columns

| | GVLs For Other Columns | WLs For Other Rows | Gate Nodes Of FeFets In Other Columns & Other Rows | SL1s For Other Rows | SL2s For Other Columns | En/Din/Dout For TSI1s On GVLs For Other Columns | En/Din/Dout For TSI2s On SL2s For Other Columns | En/Din/Dout For TSI3s On WLs For Other Rows | En/Din/Dout For TSI4s On SL1s For Other Rows |
|---|---|---|---|---|---|---|---|---|---|
| Program (Low VT) | HiZ | HiZ | Flt | HiZ | HiZ | low/low or high/HiZ | low/low or high/HiZ | low/low/HiZ | low/low or high/HiZ |
| Erase (High VT) | HiZ | HiZ | Flt | HiZ | HiZ | low/low or high/HiZ | low/low or high/HiZ | low/low/HiZ | low/low or high/HiZ |

FIG. 5D

Conditions During Switch Mode Operation Of All FeFets

| | GVLs For All Columns | WLs For All Rows | Gate Nodes Of All FeFets | SL1s For All Rows | SL2s For All Columns | En/Din/Dout for TSI1s To All GVLs | En/Din/Dout for all TSI2s To All SL2s | En/Din/Dout for TSI3s To All WLs | En/Din/Dout For TSI4s To All SL1s |
|---|---|---|---|---|---|---|---|---|---|
| Switch Mode | Vsw | Vsw+Vth | Vsw | HiZ (plus any Input Signal) | HiZ (plus any Output Signal) | high/low/high= Vsw | low/low or high/Hz | high/low/high= Vsw+Vth | low/low or high/Hz |

FIG. 5E

| | Volts |
|---|---|
| Vdd | 1 |
| Vss | 0 |
| Vp | 2.5-3.0 (e.g., 2.5) |
| Ve | 2.5-3.0 (e.g., 2.5) |
| Low VT | 0 |
| High VT | 1.5 |
| Vsw | 1.1-1.2 (e.g., 1.1) |

FIG. 5F

STRUCTURE INCLUDING A CROSS-BAR ROUTER AND METHOD

BACKGROUND

Field of the Invention

The present invention relates to routers and, more particularly, to structures including a cross-bar router and methods of operating the structures.

Description of Related Art

A cross-bar router typically includes an array of signal lines and, particularly, parallel first signal lines oriented in a first direction overlayed by parallel second signal lines oriented in a second direction that is essentially perpendicular to the first direction. Switches are located at the intersections between the first and second signal lines and these switches can be selectively controlled so that any first signal line can be electrically connected to any one or more of the second signal lines for signal routing. The switches of such a cross-bar router are often implemented using programmable resistive random access memory (RRAM) devices or static random access memory (SRAM) devices, leading to cross-bar routers that consume large amounts of power and chip area.

SUMMARY

Generally, disclosed herein are embodiments of a structure including a cross-bar router. The cross-bar router can include an array of programmable transistors arranged in rows and columns. Each programmable transistor can have an electric field-based programmable threshold voltage. The cross-bar router can further include first signal lines for the rows. Each first signal line can be connected to first source/drain terminals of all of the programmable transistors in a corresponding row. The cross-bar router can further include second signal lines for the columns. Each second signal line can be connected to second source/drain terminals of all of the programmable transistors in a corresponding column.

Also disclosed herein are embodiments of a structure including a cross-bar router and mode control circuitry for the cross-bar router and, particularly, for facilitating program, erase, and switch mode operations in the cross-bar router. Specifically, the cross-bar router can include an array of programmable transistors arranged in rows and columns. Each programmable transistor can have an electric field-based programmable threshold voltage. The cross-bar router can further include first signal lines for the rows. Each first signal line can be connected to first source/drain terminals of all of the programmable transistors in a corresponding row. The cross-bar router can further include second signal lines for the columns. Each second signal line can be connected to second source/drain terminals of all of the programmable transistors in a corresponding column. As mentioned above, the structure can also include mode control circuitry. The mode control circuitry can be connected to the array of programmable transistors. The mode control circuitry can be configured to cause selective operation of each of the programmable transistors in either a program mode to set a first threshold voltage or an erase mode to set a second threshold voltage that is different from (e.g., higher than) the first threshold voltage. The mode control circuitry can further be configured to cause concurrent operation of all of the programmable transistors in a switch mode. During operation in the switch mode, any programmable transistor having the first threshold voltage becomes conductive forming a connected pair of first and second signal lines and any programmable transistor having the second threshold voltage remains non-conductive.

Also disclosed herein are method embodiments for operating the above-described structures. The method can include providing a structure including a cross-bar router and mode control circuitry for the cross-bar router and, particularly, for facilitating program, erase, and switch mode operations in the cross-bar router. The cross-bar router can include an array of programmable transistors. The programmable transistors can be arranged in rows and columns and can have electric field-based programmable threshold voltages. The programmable transistors can further be connected to first signal lines for the rows and second signal lines for the columns. That is, each first signal line can be connected to first source/drain terminals of all of the programmable transistors in a corresponding row. Additionally, each second signal line is connected to second source/drain terminals of all of the programmable transistors in a corresponding column. The method can further include causing, by the mode control circuitry, each programmable transistor to operate in either a program mode or an erase mode. The program mode sets the electric field-based programmable threshold voltage of the programmable transistor at a first threshold voltage. The erase mode sets the electric field-base programmable threshold of the programmable transistor at a second threshold voltage that is different from (e.g., higher than) the first threshold voltage. The method can further include causing, by the mode control circuitry, the programmable transistors to concurrently operate in a switch mode. In the switch mode, any programmable transistor having the first threshold voltage becomes conductive forming a connected pair of first and second signal lines and any programmable transistor having the second threshold voltage remains non-conductive.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 2A and 2B are cross-section diagrams illustrating different VT states, respectively, of an exemplary N-type ferroelectric field effect transistor (FeFET) that can be incorporated into the cross-bar router of FIG. 1;

FIGS. 5A-5F are tables illustrating exemplary mode-specific voltage conditions for operation of the structure of FIG. 4B;

DETAILED DESCRIPTION

Figure 1:
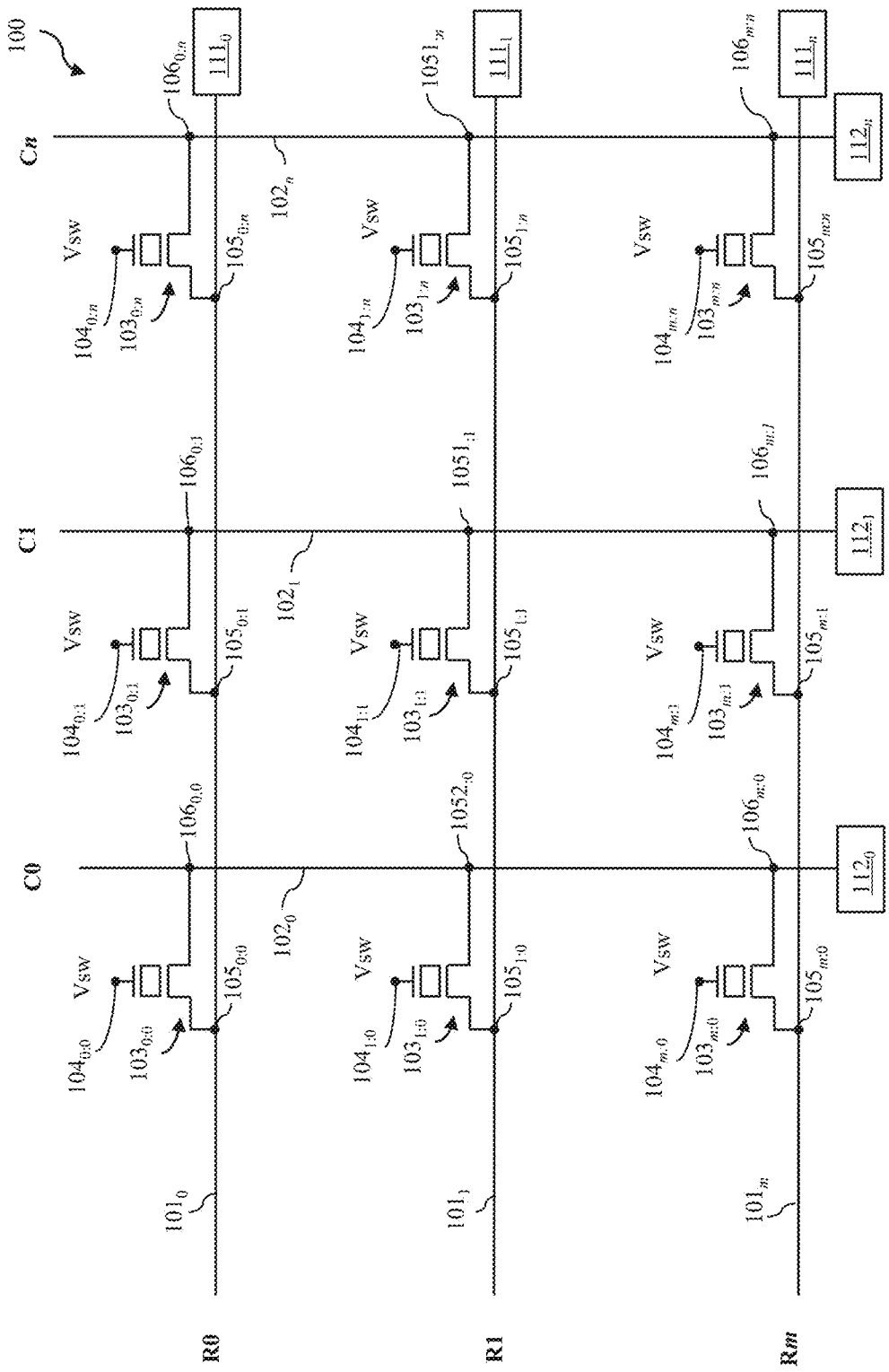
FIG. 1 is a schematic diagram illustrating disclosed embodiments of a cross-bar router.

As mentioned above, a cross-bar router typically includes an array of switches arranged in rows (e.g., in the X-direction, as illustrated) and columns (e.g., in the Y-direction, as illustrated). The cross-bar router can further include signal lines and, more particularly, parallel first signal lines for the rows (e.g., oriented in the X-direction) overlayed by parallel second signal lines for the columns (e.g., oriented the Y-direction and essentially perpendicular to the first signal lines). The first signal lines can have first input/output nodes, respectively. The second signal lines can have second input/output nodes, respectively. The switches can be located at the intersections between the first and second signal lines and can be selectively controlled so that any first signal line can be electrically connected to any one or more of the second signal lines to create signal paths between connected pairs of first and second signal lines in order to facilitate signal routing. Typically, the switches in a switch bar router are implemented using programmable resistive random access memory (RRAM) devices or static random access memory (SRAM) devices. RRAM and SRAM devices can be relatively large, can require complex control circuitry to operate as switches within a switch bar router, and, as a result, consume large amounts of power and chip area.

In view of the foregoing, disclosed herein are embodiments of structure including a cross-bar router. The cross-bar router can include an array of programmable transistors arranged in rows and columns. Each programmable transistor can have an electric field-based programmable threshold voltage. That is, the threshold voltage (VT) of each transistor is programmable using an electric field as opposed to current flow. Thus, for example, the programmable transistors can be ferroelectric field effect transistors (FeFETs), charge trap field effect transistors (CTFETs) or any other field effect transistors (FETs) configured for electric field-induced threshold voltage switching. The cross-bar router can also include first signal lines (e.g., input signal lines) for the rows and each first signal line can be connected to first source/drain terminals of all of the transistors in a corresponding row. The cross-bar router can also include second signal lines (e.g., output signal lines) for the columns and each second signal line can be connected to second source/drain terminals of all of the programmable transistors in a corresponding column. Also disclosed herein are embodiments of a structure that includes a cross-bar router, as described above, and mode control circuitry for the cross-bar router and, particularly, for facilitating program, erase, and switch mode operations in the cross-bar router. Specifically, the mode control circuitry can cause selective operation of each programmable transistor in either a program mode to set a first VT or an erase mode to set a second VT that is different from (e.g., higher than) the first VT, while protecting the current VT state of the other programmable transistors in the array. The mode control circuitry can further cause concurrent operation of the programmable transistors in a switch mode and, when operating in the switch mode, the programmable transistors may or may not become conductive depending upon their respective VTs. Transistors that become conductive form connected pairs of first and second signal lines and, thus, create signal paths. Also discussed herein are method embodiments for operating such structures.

FIG. 1 is a schematic diagram illustrating disclosed embodiments of a cross-bar router 100. The cross-bar router 100 can include an array of programmable transistors 103 arranged in rows (R0-Rm) and in columns (C0-Cn). Thus, each programmable transistor is located at an intersection between a row and a column. It should be noted that at least some of the reference numbers in the figures include subscripts. Depending upon the feature at issue, the subscript indicates, a specific row of the rows 0 to m, a specific column of the columns 0 to n, or an intersection between a specific row and a specific column (e.g., 0:0 to m:n). Thus, for example, the programmable transistor $103_{0:0}$ is located at the intersection of R0 and C0, the programmable transistor $103_{0:1}$ is located at the intersection of R0 and C1, and so on. Additionally, three rows of programmable transistors and three columns of programmable transistors are shown in the figures. However, it should be understood that the figures are not intended to be limiting. Alternatively, the cross-bar router 100 could include any number of two or more rows of programmable transistors and any number of two or more columns of programmable transistors.

The programmable transistors 103 can be FETs. Each FET can include a first source/drain terminal 105, a second source/drain terminal 106, a channel region between the first source/drain terminal 105 and the second source/drain terminal 106, and a gate terminal 104 adjacent to the channel region. Each programmable transistor 103 can further have an electric field-based programmable VT. That is, each programmable transistor 103 can be configured for electric field-induced VT switching (as opposed to current-induced VT switching) between a first VT and a second VT that is different from the first VT. For example, if the programmable transistors 103 are n-type FETs (NFETs) configured for electric field-induced VT switching, then each NFET can be operable in a program mode to set a first VT (e.g., a relatively low VT, such as a VT of 0V or some other low VT) or in an erase mode to set a second VT that is higher than the first VT (e.g., to set a relatively high VT, such as a VT of 1.5V or some VT that is higher than the low VT.

Programmable transistors 103 configured for electric field-induced VT switching include, but are not limited to, FeFETs and CTFETs.

FIGS. 2A and 2B are cross-section diagrams illustrating different VT states of an exemplary N-type FeFET that can be incorporated into the array as the programmable transistors 103. This N-type FeFET can include N+ source/drain terminals 205-206 and a channel region 207 (e.g., an intrinsic or P− channel region, depending upon the process technology at issue) positioned between the N+ source/drain terminals 205-206. The N-type FeFET can further include a gate terminal 204 adjacent to the channel region 207. This gate terminal 204 can be a multi-layered structure including, for example, a gate dielectric layer 282 on the channel region 207, a ferroelectric layer 283 (e.g., a hafnium oxide layer or some other suitable ferroelectric layer) on the gate dielectric layer 282, and a control gate layer 281 (e.g., a metal gate layer) on the ferroelectric layer 283. With such a gate terminal 204, the N-type FeFET has an electric field-based programmable VT and, particularly, has a VT that can be set at a first VT (i.e., a low VT, such as a VT of 0V) or a second VT that is higher than the first VT (i.e., a high VT, such as a VT of 1.5V) depending upon the bias conditions on the gate terminal 204 and source/drain terminals 205-206.

To achieve electric field-induced switching to the first VT, the FeFET can be operated in a program mode (also referred to as a low VT write mode). In the program mode, a positive voltage pulse (referred to herein as a program mode voltage pulse (Vp)) that is, for example, within the range of approximately 2.5V to approximately 3.0V can be applied to the gate terminal 204 and a ground voltage pulse (Gnd) of, for example, 0V can be applied to the N+ source/drain terminals 205-206. This results in the direction of polarization vector of the ferroelectric layer 283 pointing toward the channel region 207 (i.e., it results in + poles of di-poles in the layer 283 being adjacent to the channel region 207 and − poles of the dipoles being adjacent to the control gate layer 281) such that electrons are attracted to the channel region 207, thereby decreasing the VT down to the first VT (see FIG. 2A). When the first VT is set, the channel region 207 between the N+ source/drain terminals 205-206 will become conductive in response to a switch mode voltage pulse (Vsw), which is subsequently applied to the gate terminal 204 during switch mode operation and which is between the first VT and the second VT but significantly lower than Vp.

To achieve electric field-induced switching to the second VT, the FeFET can be operated in an erase mode (also referred to as a high VT write mode). In the erase mode, Gnd can be applied to the gate terminal 204 and a positive voltage pulse (referred to herein as an erase mode voltage pulse (Ve)) that is, for example, within the range of approximately 2.5V to approximately 3.0V can be applied to the N+ source/drain terminals 205-207 or, alternatively, a negative voltage pulse can be applied to the gate terminal 204 and Gnd can be applied to the N+ source/drain terminals 205-206. Either way, this results in the direction of polarization vector of the ferroelectric layer 283 pointing toward the control gate layer 281 (i.e., it results in + poles of di-poles in the layer 283 being adjacent to the control gate layer 281 and − poles of the dipoles being adjacent to the channel region 207) such that electrons are repelled from channel region 207, thereby increasing the VT up to the second VT (see FIG. 2B). When the second VT is set, the channel region 207 will remain non-conductive in response to Vsw during a subsequent switch mode operation. It should be noted that Ve can be at the same voltage level as Vp (e.g., Vp=Ve=2.5V) or at a different level, but in any case Vsw should be significantly lower than Vp and Ve to avoid unintended VT switching.

Figure 3A:
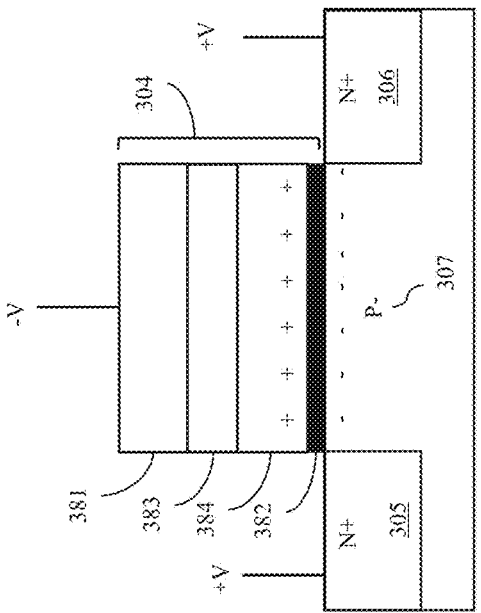
FIGS. 3A and 3B are cross-section diagrams illustrating different VT states, respectively, of an exemplary N-type charge trap field effect transistor (CTFET) that can be incorporated into the cross-bar router of FIG. 1.
Figure 3B:
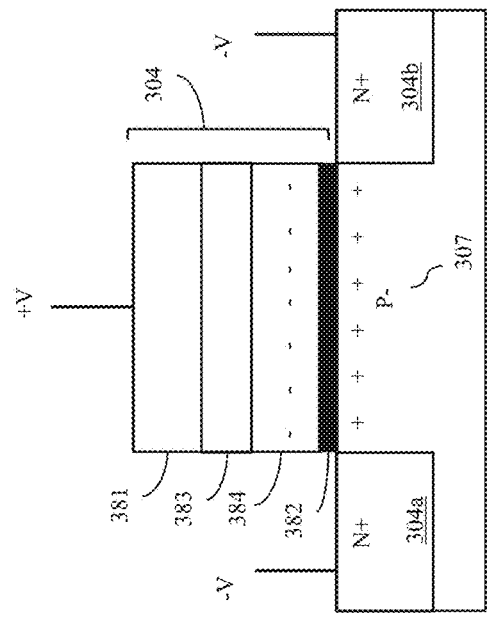

FIGS. 3A and 3B are cross-section diagrams illustrating different VT states of an exemplary N-type CTFET that could, alternatively, be incorporated into the array as the programmable transistors 103. This N-type CTFET can include N+ source/drain terminals 305-306 and a channel region 307 (e.g., an intrinsic or P− channel region, depending upon the process technology at issue) positioned between the N+ source/drain terminals 305-306. The N-type CTFET can further include a gate terminal 304 adjacent to the channel region 307. The gate terminal 304 can be a multi-layered structure including, for example, a gate dielectric layer 382 on the channel region 307, a charge trap layer 384 (e.g., a silicon nitride layer) on the gate dielectric layer 382, another gate dielectric layer 383 on the charge trap layer 384 and a control gate layer 381 (e.g., a metal gate layer) on the gate dielectric layer 383. With such a gate terminal 304, the N-type CTFET has an electric field-based programmable VT and, particularly, a VT that can be set at a first VT (i.e., a low VT, such as a VT of 0V) or a second VT that is higher than the first VT (i.e., a high VT, such as a VT of 1.5V) depending upon the bias conditions on the gate and source/drain terminals.

To achieve electric field-induced switching to the first VT, the CTFET can be operated in a program mode (also referred to as a low VT write mode). In this case, in the program mode, a negative voltage pulse (−Vp) can be applied to the gate terminal 304 and a positive voltage pulse (Vp) can be applied to the N+ source/drain terminals 305-306. This results in electrons moving out of the charge trap layer 384, thereby decreasing the VT down to the first VT (see FIG. 3A). When the first VT is set, the channel region 307 between the N+ source/drain terminals 305-306 will become conductive in response to Vsw, which is subsequently applied to the gate terminal 304 during switch mode operation and which is between the first VT and the second VT.

To achieve electric field-induced switching to the second VT, the CTFET can be operated in an erase mode (also referred to as a high VT write mode). In the erase mode, a positive voltage pulse (Ve) can be applied to the gate terminal 304 and a negative voltage pulse (−Ve) can be applied to the N+ source/drain terminals 305-306. This results in electrons moving into and being trapped by the charge trap layer 384, thereby increasing the VT to the second VT (see FIG. 3B). When the second VT is set, the channel region 307 will remain non-conductive in response to Vsw during subsequent switch mode operation.

The exemplary program and erase mode specifications employed for N-type FeFETs and N-type CTFETs discussed above are provided for illustration purposes and not intended to be limiting. Those skilled in the art will recognize that similar electric field-based VT switching could be achieved in N-type FeFets using a combination of a lower positive voltage pulse and a negative voltage pulse (as opposed to the positive and ground voltage pulses) and in N-type CTFETs using a higher positive voltage pulse and a ground voltage pulse (as opposed to positive and negative voltage pulses). Additionally, for purposes of illustration, the FeFETs and CTFETs described above and illustrated in FIGS. 2A-2B and 3A-3B are NFETs. However, it should be understood that the figures and discussion thereof are not intended to be limiting. Alternatively, FeFETs or CTFETs incorporated into the cross-bar router 100 as programmable transistors 103 could be p-type FETs (PFETs). Those skilled in the art would recognize that different bias conditions would be required for the different operation modes (e.g., the program, erase, and switch modes).

In any case, the cross-bar router 100 can further include wires and, more particularly, parallel first signal lines (SL1s) 101 for the rows (R0-Rm), respectively (e.g., oriented in the X-direction, as illustrated) overlayed by parallel second signal lines (SL2s) 102 for the columns (C0-Cn), respectively (e.g., oriented the Y-direction, as illustrated, and essentially perpendicular to the first signal lines). The SL1s 101 can have first input/output nodes 111, respectively (e.g., for receiving input signals during switch mode operation, as discussed in greater detail below). The SL2s 102 can have second input/output nodes 112, respectively (e.g., for outputting output signals during switch mode operation, as discussed in greater detail below). Each SL1 101 can further be connected to all of the programmable transistors 103 in a corresponding row and, particularly, to the first source/drain terminals 105 (e.g., source terminals in the case of NFETs) of all the programmable transistors 103 in a corresponding row. That is, the SL1 $101_0$ for the row (R0) can be connected to first source/drain terminals $105_{0:0}$ to $105_{0:n}$ of the programmable transistors $103_{0:0}$ to $103_{0:n}$, respectively, in the row (R0); the SL1 $101_1$ for the next row (R1) can be connected to first source/drain terminals $105_{1:0}$ to $105_{1:n}$ of the programmable transistors $103_{1:0}$ to $103_{1:n}$, respectively, in row (R1); and so on. Similarly, each SL2 102 can be connected to all of the programmable transistors 103 in a corresponding column and, particularly, to the second source/drain terminals 206 (e.g., drain terminals in the case of NFETs) of all the programmable transistors 103 in a corresponding column. That is, the SL2 $102_0$ for the column (C0) can be connected to second source/drain terminals $106_{0:0}$ to $106_{m:0}$ of the programmable transistors $103_{0:0}$ to $103_{m:0}$ in the column (C0); the SL2 $102_1$ for the next column (C1) can be connected to second source/drain terminals $106_{0:1}$ to $106_{m:1}$ of the programmable transistors $103_{0:1}$ to $103_{m:1}$, respectively, in column (C1); and so on.

Within the cross-bar router 100, selected ones of the programmable transistors 103 can have the first VT and other selected ones of the programmable transistors 103 can have second VT that is different from the first VT (e.g., that is higher than the first VT). Furthermore, the programmable transistors 103 can be concurrently operable in the switch mode. During concurrent operation in the switch mode, some of the programmable transistors 103 will become conductive forming connected pairs of first and second signal lines and, thereby signal paths between corresponding pairs of first and second input/output nodes, and others of the programmable transistors 103 remain non-conductive (i.e., will not create signal paths). Whether a given programmable transistor becomes conductive or remains non-conductive is VT-dependent. For example, consider a cross-bar router 100 where the programmable transistors 103 are NFETs, such as n-type FeFETs as shown in FIGS. 2A-2B and discussed above or n-type CTFETs as shown in FIGS. 3A-3B and discussed above. When the programmable transistors 103 concurrently operate in the switch mode, the first source/drain terminals 105 and the second source/drain terminals 106 float due to high impedance (HiZ) states established on the SL1s 101 (which are connected to the first source/drain terminals 105) and on the SL2s 102 (which are connected to the second source/drain terminals 106). Additionally, the gate terminals 104 of all of the programmable transistors 103 receive a positive switch mode voltage pulse (Vsw), which is at a level between the first VT and the second VT. Under these conditions, any programmable transistor 103 having the first VT will be become conductive forming a corresponding connected pair of first and second signal lines. For example, if the programmable transistor 103 00 becomes conductive, SL1 $101_0$ and the SL2 $102_0$ become a connected pair; if the programmable transistor $103_{0:1}$ becomes conductive, SL1 $101_0$ and the SL2 $102_0$ become a connected pair; and so on. Furthermore, each connected pair of first and second signals 101-102 creates a corresponding signal path between a first input/output node 111 on the SL1 101 of the connected pair and a second input/output node 112 on the SL2 102 of the connected pair. For example, if SL1 $101_0$ and SL2 $102_0$ are connected pair, a corresponding signal path is created between the first input/output node $111_0$ on SL1 $101_0$ and the second input/output node $112_0$ on SL2 $102_0$; if the SL1 $101_0$ and SL2 $102_0$ are connected pair, a corresponding signal path is created between the first input/output node $111_0$ on SL1 $101_0$ and the second input/output node $112_1$ on the SL2 $102_1$; and so on. Thus, in the switch mode, signal communication along signal paths created by connected pairs of first and second signal lines is enabled.

Also disclosed herein are embodiments of structures that include both the cross-bar router 100 (as discussed in detail above) and mode control circuitry (as discussed in greater detail below). The mode control circuitry cause (i.e., can be configured to cause, adapted to cause, connected so as to be able to cause, etc.) selective operation of any programmable transistor 103 (or optionally multiple programmable transistors in the same column or the same row concurrently) in either the program mode to set the first VT or the erase mode to set the second VT and to do so without risking inadvertent switching of the current VT state of unselected programmable transistors (i.e., while protecting the current VT state of unselected programmable transistors). The mode control circuitry can further cause (i.e., can be configured to cause, adapted to cause, connected so as to be able to cause, etc.) concurrent operation of all of the programmable transistors 103 in a switch mode so that any programmable transistor 103 having the first VT becomes conductive to form a connected pair of first and second signal lines and so that any programmable transistor having the second VT remains non-conductive.

Figure 4A:
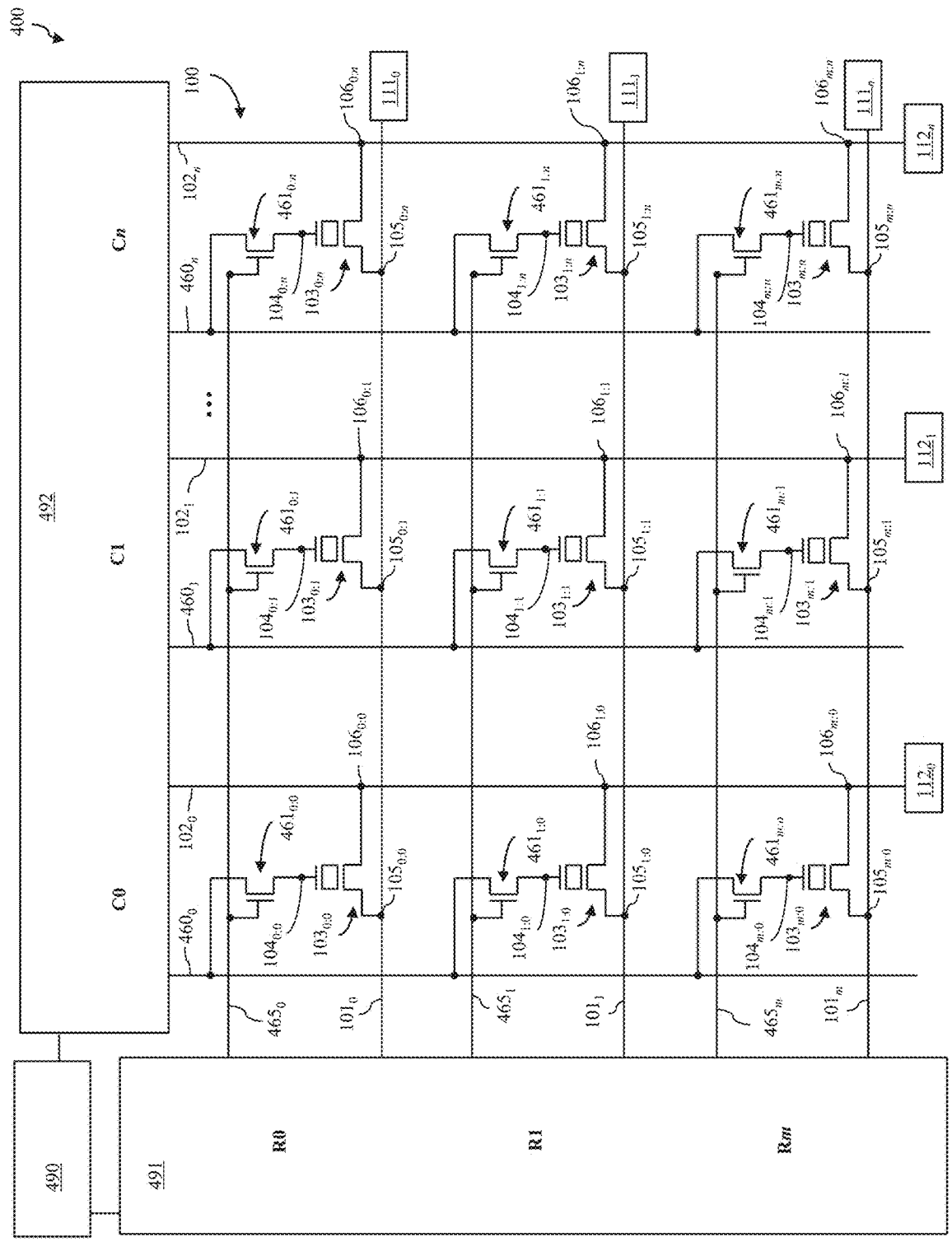
FIG. 4A is a schematic diagram illustrating an embodiment of a structure that includes the cross-bar router of FIG. 1 and mode control circuitry.

FIG. 4A is a schematic diagram illustrating an embodiment of a structure 400 that includes the cross-bar router 100 and mode control circuitry. In this structure 400, the mode control circuitry can include access transistors 461 for the programmable transistors 103, respectively. Thus, the programmable transistor 103 00 has an access transistor 461 00; the programmable transistor 103 01 has the access transistor 461 01; and so on. These access transistors 461 can be, for example, NFETs.

In this structure 400, the mode control circuitry can include gate voltage lines (GVLs) 460 for the columns, respectively (e.g., see GVL $460_0$ for C0; GVL $460_1$ for C1; and so on) and wordlines (WL) 465 for the rows, respectively (e.g., see WL $465_0$ for R0; WL $465_1$ for R1; and so on). Each access transistor 461 for a given programmable transistor 103 in a given row and a given column can have a gate terminal connected to the WL 465 for the given row and can further have source/drain terminals connected to the GVL 460 for the given column and to the gate terminal 104 of the given programmable transistor 103. For example, the gate of the access transistor $461_{0:0}$ for programmable transistor $103_{0:0}$ in R0 and C0 is connected to the WL $465_0$ for the R0, one source/drain region of the access transistor $461_{0:0}$ is connected to the GVL $460_0$ for C0 and the other source/drain region is connected to the gate terminal $104_{0:0}$ of the programmable transistor $103_{0:0}$ the gate terminal of the access transistor $461_{0:1}$ for programmable transistor 103 01 in R0 and C1 is connected to the WL $465_0$ for the R0, one source/drain region of the access transistor $461_{0:1}$ is connected to the GVL $460_1$ for C1 and the other source/drain region is connected to the gate terminal $104_{0:1}$ of the programmable transistor $103_{0:1}$ and so on.

In this structure 400, the mode control circuitry can further include: peripheral circuitry 491-492 connected to the WLs 465, to the first signal lines 101, to the GVLs 460, and to second signal lines 102 and a controller 490 in communication with the peripheral circuitry 491-492 and configured to facilitate operation of the programmable transistors 103 in the different modes (i.e., program, erase, and switch). For example, the peripheral circuitry can include: a row control block 491, which is connected to the WLs 465 and to the SL1s 101 for the rows; and a column control block 492, which is connected to the GVLs 460 and the SL2s 102 for the columns. The row control block 491 can include, for example, row address decode logic and drivers configured to establish appropriate bias conditions on WLs 465 and the SL1s 101 depending upon address and control signals from the controller 490 indicating the operation mode (i.e., program, erase, or switch) and the row address of a selected programmable transistor 103. The column control block 492 can include for example, column address decode logic and drivers configured to establish appropriate bias conditions on the GVLs 460 and the SL2s 102 depending upon address and control signals from the controller 490 indicating the operation mode (i.e., program, erase, or switch) and the column address of a selected programmable transistor 103.

It should be understood that the bias conditions established on the WLs, SL1s, GVLs, and the SL2s in the structure 400 will vary depending upon the conductivity type of the programmable transistors (i.e., depending upon whether the programmable transistors are NFETs or PFETs), depending upon how the programmable transistors are configured to have electric-field base programmable threshold voltages (i.e., depending upon whether the programmable transistors are FeFETs, CTFETs, etc.), depending upon the particular mode of operation (i.e., the program mode to set the first VT in a selected programmable transistor, the erase mode to set the second VT in a selected programmable transistor, or the switch mode for signal routing purposes), depending upon the row and column address of the selected programmable transistor when operating in the program mode or the erase mode, and depending upon the need to protect non-selected programmable transistors from inadvertent VT switching during operation of a selected programmable transistor in the program mode or erase mode.

For example, consider the cross-bar router 100 shown in FIG. 4A where the programmable transistors are all n-type FeFETs, where the first VT (i.e., the low VT) is, for example, 0V and where the second VT (i.e., the high VT) is, for example, 1.5V.

For the program mode in a selected programmable transistor 103 located at a specific address (i.e., at the intersection of a specific column and a specific row), the mode control circuitry and, particularly, the row control block 491 and the column control block 492 can, in response to address and mode control signals from the controller 490, establish the following bias conditions on the WLs 465, SL1s 101, GVLs 460, and SL2s 102. A program operation wordline voltage pulse can be applied to the specific WL 465 for the specific row containing the selected programmable transistor 103. The voltage level of this program operation wordline voltage pulse can be at least equal to the sum of both a positive program mode voltage pulse (Vp) (which as discussed below will be applied to the gate terminal of the selected programmable transistor) and an access transistor VT (i.e., the VT of the access transistor 461 for the programmable transistor 103). A ground voltage pulse (Gnd) can be applied to the specific SL1 101 for the specific row containing the selected programmable transistor 103. A HiZ state can be established all other WLs 465 and on all other SL1s 101 for all other rows. Vp can be applied to the specific GVL 460 for the specific column containing the selected programmable transistor 103, Gnd can be applied to a specific SL2 102 for the specific column, and the HiZ state can be established on all other GVLs 460 and all other SL2s 102 for all other columns. It should be noted that Vp can be a relatively high positive voltage pulse, which is significantly higher than the current VT of the programmable transistor (e.g., within the range of approximately 2.5V to approximately 3.0V). Thus, for example, in some embodiments Vp can be 2.5V.

As a result of these bias conditions during program mode operation: when the program operation wordline voltage is applied to the gate terminal of a specific access transistor 461 for a selected programmable transistor 103, that specific access transistor 461 turns on; when the specific access transistor 461 turns on, Vp from the specific GVL 460 connected to the specific access transistor 461 is applied to the gate terminal 104 of the selected programmable transistor 103; and Gnd is also applied to the first source/drain terminal 105 of the selected programmable transistor 103 by the specific SL1 101 connected to the selected programmable transistor and to the second source/drain terminal 106 of the selected programmable transistor 103 by the specific SL2 102 connected to the selected programmable transistor 103. Thus, the selected programmable transistor 103 is programmed to have the first VT (i.e., the low VT, such as a VT of 0V). Also, as a result of these bias conditions during program mode operation, VT switching in unselected programmable transistors in the array is avoided.

For example, consider the program mode operation in a selected programmable transistor 103 00 located at the intersection of R0 and C0. The program operation wordline voltage pulse is applied to WL $465_0$, Gnd is applied to the SL1 $101_0$, and the HiZ state is established on WLs $465_{1-m}$ and on SL1s $101_{1-m}$. Additionally, Vp is applied to GVL $460_0$, Gnd is applied to the SL2 $102_0$, and the HiZ state is established on GVLs $460_{1-n}$ and on SL2s $102_{1-n}$. In this case, for unselected programmable transistors $103_{1:1}$ to $103_{m:n}$ in different rows (R1-Rm) and in different columns (C1-Cn), the HiZ states on the WLs $465_{1-m}$, on the SL1s $101_{1-m}$, on the GVLs $460_{1-n}$, and on the SL2s $102_{1-n}$ ensure that the gate terminals $104_{1:1}$ to $104_{m:n}$ of the unselected programmable transistors $103_{1:1}$ to $103_{m:n}$ are floating and further ensure that the first source/drain terminals $105_{1:1}$ to $105_{m:n}$ and the second source/drain terminals $106_{1:1}$ to $106_{m:n}$ of those unselected programmable transistors $103_{1:1}$ to $103_{m:n}$ are at HiZ and, thus, conditions required for VT switching are not met. Furthermore, for unselected programmable transistors in the same column (C0) but different rows (R1-Rm), the HiZ states on the WLs $465_{1-m}$ and on the SL1s 101 ensure that the gate terminals $104_{1:0}$ to $104_{m:0}$ and the first source/drain terminals $105_{1:0}$ to $105_{m:0}$ of the unselected programmable transistors $103_{1:0}$ to $103_{m:0}$ in C0 are floating and at HiZ, respectively and, thus, the conditions required for VT switching are not met even though the second source/drain terminals $106_{1:0}$ to $106_{m:0}$ are at ground. Additionally, for unselected programmable transistors in the same row (R0) but different columns (C1-Cn), the HiZ states on the GVLs $460_{1-n}$, and on the SL2s $102_{1-n}$ ensure that the gate terminals $104_{0:1}$ to $104_{0:n}$ and the second source/drain terminals $106_{0:1}$ to $106_{1:n}$ of the unselected programmable transistors $103_{0:1}$ to $103_{1:n}$ in R0 are floating and at HiZ, respectively, and, thus, the conditions required for VT switching are not met even though the access transistors $461_{0:1}$ to $461_{0:n}$ for the unselected programmable transistors $103_{0:1}$ to $103_{0:n}$ are turned on and the first source/drain terminals $105_{0:1}$ to $105_{1:n}$ are at ground.

For the erase mode in a selected programmable transistor located at a specific address (i.e., at the intersection of a specific column and a specific row), the mode control circuitry and, particularly, the row control block 491 and the column control block 492 can, in response to address and mode control signals from the controller 490, establish the following bias conditions on the WLs 465, SL1s 101, GVLs 460, and SL2s 102. An erase operation wordline voltage pulse can be applied to the specific WL 465 for the specific row containing the selected programmable transistor 103. The voltage level of this erase operation wordline voltage pulse can, optionally, be the same as the program operation wordline voltage pulse or in any case can at least equal to the access transistor threshold voltage (i.e., the VT of the access transistor 461 for the programmable transistor 103). An erase mode voltage pulse (Ve) can be applied to the specific SL1 101 for the specific row containing the selected programmable transistor 103. A HiZ state can be established all other WLs 465 and on all other SL1s 101 for all other rows. Additionally, Gnd can be applied to the specific GVL 460 for the specific column containing the selected programmable transistor 103, Ve can be applied to a specific SL2 102 for the specific column, and the HiZ state can be established on all other GVLs 460 and all other SL2s 102 for all other columns. It should be noted that Ve can be the same as Vp or different from Ve, but in any case it too can be a relatively high positive voltage pulse such as within the range of approximately 2.5V to approximately 3.0V. Thus, for example, Ve can also be 2.5V.

As a result of these bias conditions during erase mode operation: when the erase operation wordline voltage is applied to the gate terminal of a specific access transistor 461 for a selected programmable transistor 103, that specific access transistor 461 turns on; when the specific access transistor 461 turns on, Gnd from the specific GVL 460 connected to the specific access transistor 461 is applied to the gate terminal 104 of the selected programmable transistor 103; Ve is also applied to the first source/drain terminal 105 of the selected programmable transistor 103 by the specific SL1 101 connected to the selected programmable transistor and to the second source/drain terminal 106 of the selected programmable transistor 103 by the specific SL2 102 connected to the selected programmable transistor 103. Thus the selected programmable transistor 103 is erased (i.e., the VT of the selected programmable transistor is set at the second VT that is higher than the first VT and, particularly, to a relatively high VT, such as to a VT of 1.5V). Also, as a result of these bias conditions during erase mode operation, VT switching in unselected programmable transistors in the array is avoided.

For example, consider the erase mode operation the selected programmable transistor $103_{0:0}$ located at the intersection of R0 and C0. The erase operation wordline voltage pulse is applied to WL $465_0$, Ve is applied to the SL1 $101_0$, and the HiZ state is established on WLs $465_{1-m}$ and on SL1s $101_{1-m}$. Additionally, Gnd is applied to GVL $460_0$, Ve is applied to SL2 $102_0$, and the HiZ state is established on GVLs $460_{1-n}$ and on SL2s $102_{1-n}$. In this case, for unselected programmable transistors $103_{1:1}$ to $103_{m:n}$ in different rows (R1-Rm) and in different columns (C1-Cn), the HiZ states on the WLs $465_{1-m}$, on the SL1s $101_{1-m}$, on the GVLs $460_{1-n}$, and on the SL2s $102_{1-n}$, ensure that the gate terminals $104_{1:1}$ to $104_{m:n}$ of the unselected programmable transistors $103_{1:1}$ to $103_{m:n}$ are floating and further ensure that the first source/drain terminals $105_{1:1}$ to $105_{m:n}$ and the second source/drain terminals $106_{1:1}$ to $106_{m:n}$, of those unselected programmable transistors $103_{1:1}$ to $103_{m:n}$ are at HiZ and, thus, the conditions required for VT switching are not met. Furthermore, for unselected programmable transistors in the same column (C0) but different rows (R1-Rm), the HiZ states on the WLs 465 1, and on the SL1s $10_{1-m}$ ensure that the gate terminals $104_{1:0}$ to $104_{m:0}$ and the first source/drain terminals $105_{1:0}$ to $105_{m:0}$ of the unselected programmable transistors $103_{1:0}$ to $103_{m:0}$ in C0 are floating and at HiZ, respectively and, thus, the conditions required for VT switching are not met even though the second source/drain terminals $106_{1:0}$ to $106_{m:0}$ are at Ve. Additionally, for unselected programmable transistors in the same row (R0) but different columns (C1-Cn), the HiZ states on the GVLs $460_{1-n}$ and on the SL2s $102_{1-n}$ ensure that the gate terminals $104_{0:1}$ to $104_{0:n}$ and the second source/drain terminals $106_{0:1}$ to $106_{1:n}$ of the unselected programmable transistors $103_{0:1}$ to $103_{1:n}$ in R0 are floating and at HiZ, respectively, and, thus, the conditions required for VT switching are not met even though the access transistors $461_{0:1}$ to $461_{0:n}$ for the unselected programmable transistors $103_{0:1}$ to $103_{0:n}$ are turned on and the first source/drain terminals $105_{0:1}$ to $105_{1:n}$ are at Ve.

It should be noted that multiple programmable transistors from the same column can be selected for concurrent program or erase operations and, in this case, the specific WL and the specific SL1 for each row containing a selected programmable transistor in the same column will be biased as described above and the HiZ state will be established on any remaining WLs and SL1s connected to any unselected programmable transistors in the same column. Similarly, multiple programmable transistors from the same row can be selected for concurrent program or erase operations and, in this case, the specific GVL and the specific SL2 for each column containing a selected programmable transistor in the same row will be biased as described above and the HiZ state will be established on any remaining GVLs and SL2s connected to any unselected programmable transistors in the same row.

For concurrent operation of all of the programmable transistors 103 in the switch mode, the mode control circuitry and, particularly, the row control block 491 and the column control block 492 can, in response to address and control signals from the controller 490, establish the following bias conditions on the WLs 465, SL1s 101, GVLs 460, and SL2s 102. A switch operation wordline voltage pulse can be applied to all of the WLs 465 for all of the rows. The voltage level of this switch operation wordline voltage pulse can be at least equal to the sum of both the voltage levels of a positive switch mode voltage pulse (Vsw) and an access transistor threshold voltage (i.e., the VT of the access transistor 461 for the programmable transistor 103). Vsw can be applied to all of the GVLs 460. HiZ states can be established all SL1s 101 and all SL2s 102. It should be noted that Vsw can be at some voltage level between the first VT (e.g., 0V) and the second VT (e.g., 1.5V) (as discussed above) and will be significantly lower that Vp or Ve (e.g., if Vp=Ve=2.5V, then Vsw can be within the range of approximately 1.1V to approximately 1.2V).

As a result of these bias conditions during switch mode operation: when the switch operation wordline voltage is applied to the gate terminals of all access transistors 461 for all of the programmable transistors 103, the access transistors 461 turn on; when the access transistors 461 turns on, Vsw from the GVLs 460 is applied to the gate terminals 104 of all of the programmable transistors 103; and HiZ states are established on the first source/drain terminals 105 and the second source/drain terminals 106. Thus, any programmable transistor 103 in the array having the first VT becomes conductive forming a connected pair of first and second signal lines 101-102 and, thus, creates a signal path between a first input/output node 111 on the SL1 101 of the connected pair and a second input/output node 112 on the SL2 102 of the connected pair. Consequently, programmable transistors 103 having the first VT facilitate signal transmission between specific pairs of first and second input/output nodes 111-112 and programmable transistors 103 having the second VT block signal transmission between other pairs of first and second input/output nodes 111-112. For example, if the programmable transistor $103_{0:0}$ becomes conductive, the SL1 $101_0$ and the SL2 $102_0$ become a connected pair for facilitating signal transmission between the first input/output node $111_0$ and the second input/output node $112_0$; if the programmable transistor $103_{0:1}$ becomes conductive, the SL1 $101_0$ and the SL2 $102_1$ become a connected pair for facilitating signal transmission between the first input/output node $111_0$ and the second input/output node $112_1$; and so on. However, if the programmable transistor $103_{0:0}$ remains non-conductive, SL1 $101_0$ and SL2 $102_0$ will not be a connected pair and signal transmission between the first input/output node $111_0$ and the second input/output node $112_0$ will blocked; if the programmable transistor $103_{0:1}$ remains non-conductive, SL1 $101_0$ and SL2 $102_0$ will not become a connected pair and signal transmission between the first input/output node $111_0$ and the second input/output node $112_1$ will be blocked; and so on.

Figure 4B:
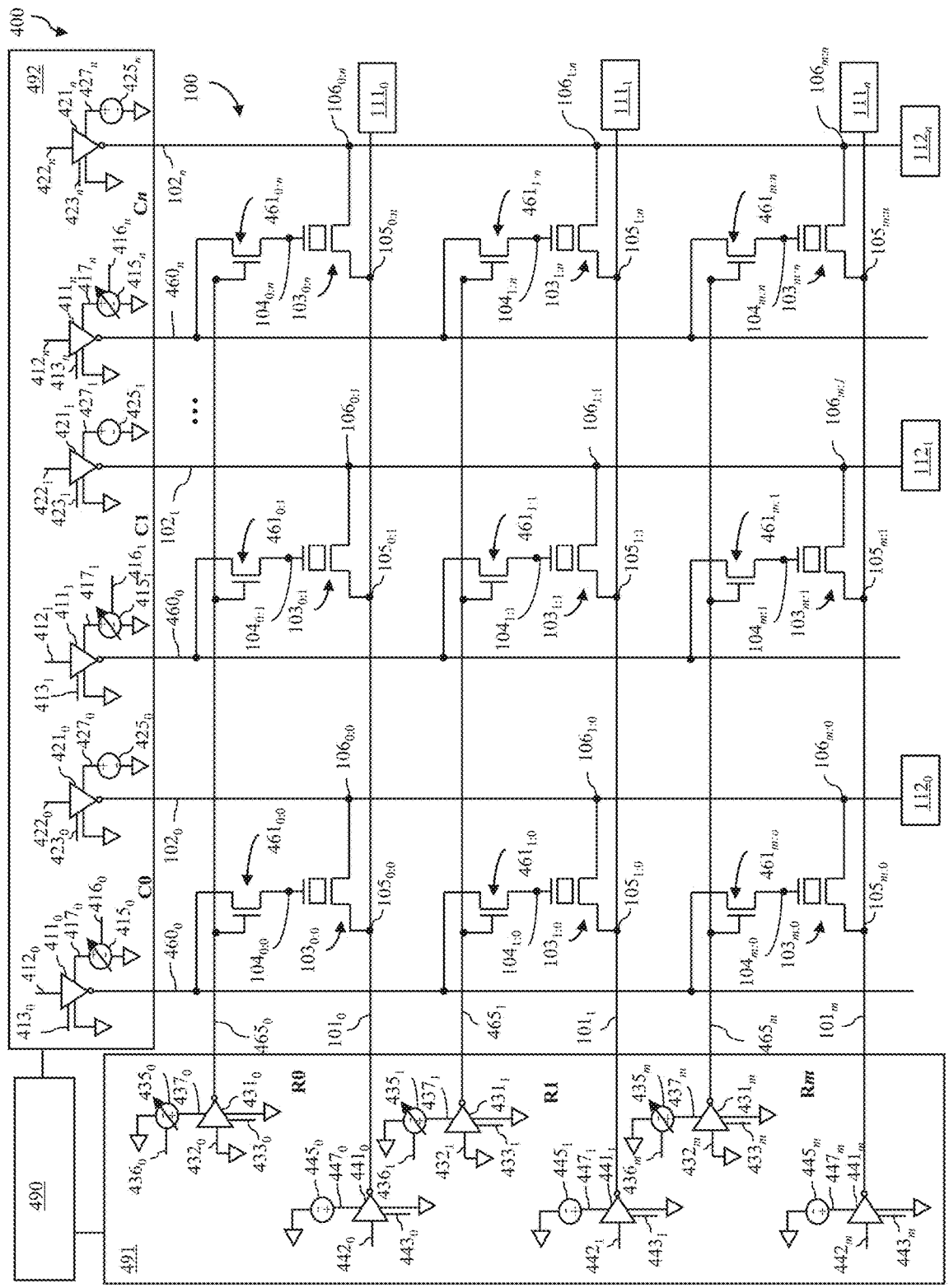
FIG. 4B is a schematic diagram illustrating, in more detail, exemplary mode control circuitry that can be incorporated into the structure of FIG. 4A.

FIG. 4B is a schematic diagram illustrating one embodiment of the structure 400 where tri-state devices are incorporated into the row control block 491 and the column control block 492 as drivers to facilitate establishing the various bias conditions on the WLs 465, the SL1s 101, the GVLs 460, and the SL2s 102 during the different operation modes (i.e., program, erase, and switch). Specifically, the column control block 492 can include, for example, include first tri-state inverters (TS1s) 411 having outputs connected to the GVLs 460 of the columns, respectively, and second tri-state inverters (TS2s) 421 having outputs connected to the SL2s 102 of the columns, respectively. The row control block 491 can include, for example, include third tri-state inverters (TS3s) 431 having outputs connected to the WLs 465 of the rows, respectively, and fourth tri-state inverters (TS4s) 441 having outputs connected to the SL1s 101 of the rows, respectively. The tri-state inverters 411, 421, 431, 441 can each include: a data signal input 412, 422, 432, 442 for receiving a row or column specific data signal from the controller 490; an enable signal input 413, 423, 433, 443 for receiving a row or column specific enable signal from the controller 490; and a positive voltage supply 417, 427, 437, 447 connected to a positive voltage source 415, 425, 435, 445.

Each tri-state inverter 411, 421, 431, 441 can output (i.e., can be configured to output, can be adapted to output, etc.) a high output (e.g., a positive voltage corresponding to the positive voltage supply level from the positive voltage source), a low output (e.g., Gnd), or HiZ output. This output can depend upon on the state of the enable signal input 413, 423, 433, 443 (e.g., high (1) or low (0)) and on the state of the data signal input 412, 422, 432, 442 (e.g., high (1) or low(0)) and can follow a conventional truth table for a tri-state inverter. For example, when the enable signal input 413, 423, 433, 443 is low, then the output will be HiZ regardless of whether the data signal input 412, 422, 432, 442 is high or low. When the enable signal input 413, 423, 433, 443 is high and the data signal input 412, 422, 432, 442 is also high, then the output will be low. When the enable signal input 413, 423, 433, 443 is high and the data signal input 412, 422, 432, 442 is low, then the output will be high.

As discussed above, the only positive voltage level needed on any of the SL1s 101 and SL2s 102 is when the erase mode voltage pulse (Ve) is applied to the SL1 and SL2 connected to a selected programmable transistor. Thus, each TSI2 421 can be connected to a fixed-voltage positive voltage source 425 that supplies Ve such that, when the enable signal input 423 to that TSI2 is high and the data signal input 422 to that TSI2 is low, the only possible output on the corresponding SL2 is Ve. Similarly, each TSI4 441 can be connected to a fixed-voltage positive voltage source 445 that supplies Ve such that, when the enable signal input 443 to that TSI4 is high and the data signal input 442 to that TSI4 is low, the only possible output on the corresponding SL1 is Ve.

However, also as discussed above, the WLs 465 and the GVLs 460 require different positive voltages during different operation modes. Specifically, during program mode operation, a WL 465 connected to the gate terminal of an access transistor 461 of a selected programmable transistor 103 should receive a positive program operation wordline voltage that is at least equal to the sum of Vp and the VT of the access transistor 461. During erase mode operation, a WL 465 connected to the gate terminal of an access transistor 461 of a selected programmable transistor 103 should receive a positive erase operation wordline voltage that is at least equal to the VT of the access transistor 461. Thus, the program and erase operation wordline voltages could be the same (e.g., to reduce complexity) or different (e.g., to save power). In any case, during the switch mode, the WLs 465 connected to all of the access transistors 461 for all of the programmable transistors 103 should receive a positive switch operation wordline voltage that is at least equal to Vsw plus the access transistor VT. Thus, each TSI3 431, which has an output connected to a WL 465, can also be connected to a variable positive voltage source 435 and the variable positive voltage source 435 can, in response to a row and mode-specific voltage select signal 436 from the controller 490, output one positive voltage supply 437 of multiple positive voltage supplies to the TSI3 431. It should be noted that, during the various operation modes described above, the WLs are either at HiZ or at one of the different positive wordline voltages, but not at Gnd. Thus, the data signal input 432 of each TSI3 can be connected directly to ground, as illustrated. Additionally, during program mode operation, a GVL 460 connected a source/drain terminal of the access transistor 461 of a selected programmable transistor should receive Vp so that the gate terminal 104 of the selected programmable transistor 103 will receive Vp once the access transistor 461 is turned on. During the switch mode, all of the GVLs 460, which are connected source/drain terminals of all of the access transistors 461 of all of the programmable transistors, should receive Vsw (which is less than Vp) such that the gate terminals 104 of all of the programmable transistors 103 also receive Vsw once the access transistors 461 are turned on. Thus, each TSI1 411, which has an output connected to a GVL 460, can also be connected to a variable positive voltage source 415 and the variable positive voltage source 415 can, in response to a column and mode-specific voltage select signal 416 from the controller 490, output one positive voltage supply 417 of multiple positive voltage supplies to the TSI1 411.

FIG. 5A is a table illustrating exemplary conditions that can be established in the mode control circuitry of the structure 400 shown in FIG. 4B to program or erase a selected FeFET in a specific row and a specific column. FIG. 5B is a table illustrating additional conditions that can be established in the mode control circuitry of the structure 400 shown in FIG. 4B, during program mode operation or during erase mode operation of a selected FeFET, to prevent unselected FeFETs in the same specific column but different rows from switching VT. FIG. 5C is a table illustrating additional conditions that can be established in the mode control circuitry of the structure 400 shown in FIG. 4B, during program mode operation or during erase mode operation of a selected FeFET, to prevent unselected FeFETs in the same specific row but different columns from switching VT. FIG. 5D is a table illustrating additional conditions that can be established in the mode control circuitry of the structure 400 shown in FIG. 4B, during program mode operation or during erase mode operation of a selected FeFET, to prevent unselected FeFETs in different columns and different rows from switching VT. FIG. 5E is a table illustrating exemplary conditions that can be established in the mode control circuitry of the structure 400 shown in FIG. 4B during concurrent switch mode operation of all FeFETs. FIG. 5F is a table illustrating exemplary values for voltages referenced in FIGS. 5A-5E.

It should be noted that the mode control circuitry of the embodiments of the structure 400 described above and illustrated in FIGS. 4A and 4B are not intended to be limiting. Alternatively, the mode control circuit can be differently configured as long as it can cause selective operation of the programmable transistors 103 in the cross-bar router 100 in either the program mode or the erase mode without risking inadvertent switching of the current VT state of unselected programmable transistors and further cause concurrent operation of all of the programmable transistors 103 in a switch mode so that any programmable transistor 103 having the first VT becomes conductive to form a connected pair of first and second signal lines and so that any programmable transistor having the second VT remains non-conductive.

Figures 6A, 6B:
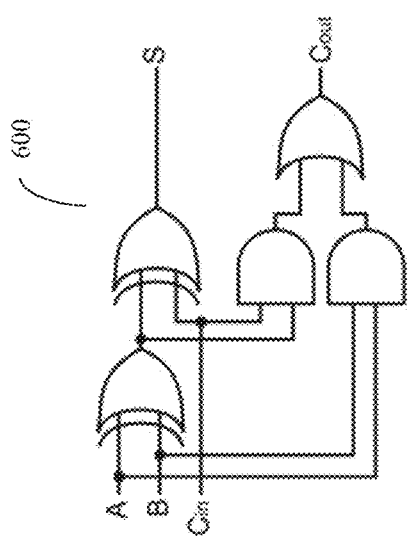
FIGS. 6A and 6B are a schematic diagram of an exemplary full adder circuit and a truth table for the full adder circuit, respectively.

Also disclosed herein are embodiments of circuits that can incorporate the above-described structures. For example, cross-bar routers, which are configured essentially the same as the cross-bar router 100 described above (along with corresponding mode control circuitry), can be incorporated into a look-up table (LUT). For example, consider the combination logic circuit and, particularly, the exemplary full adder circuit 600 shown in FIG. 6A. This full adder circuit 600 includes a set of logic gates (e.g., two XOR gates, two AND gates, and an OR gate) interconnected, as illustrated, so as to add three inputs (A, B and Cin) and to output two outputs (S and Cout). Specifically, this full adder circuit 600 can include a first XOR gate that receives A and B and outputs an intermediate output value according to a conventional XOR gate truth table (i.e., if A=B, then output=0 and if A≠B, then output=1). This full adder circuit 600 can include a first AND gate that receives A and B and outputs another intermediate output value according to a conventional AND gate truth table (i.e., if A=B=1, then output=1 otherwise output=0). The full adder circuit 600 can further include a second XOR gate that receives the intermediate output of the first XOR gate and Cin and outputs S according to the XOR gate truth table. The full adder circuit 600 can further include a second AND gate that receives the intermediate output of the first XOR gate and Cin and outputs yet another intermediate output according to the AND gate truth table. Finally, the full adder circuit 600 can further include an OR gate that receives the intermediate outputs of the first AND gate and the second AND gate and outputs Cout according to a conventional OR truth table (i.e., if A=B=0, then output=0 otherwise output=1). The full adder truth table of FIG. 6B indicates the output value S for each of the eight possible combination of input values A, B and Cin (e.g., 000, 001, 010, etc.). The full adder truth table of FIG. 6B also indicates the output value Cout for each of the eight possible combinations of input values A, B and Cin (e.g., 000, 001, 010, etc.). Instead of forming a full adder circuit with the various logic gates interconnected as shown in FIG. 6A, a pair of LUTs can be used to implement this same full adder function: one LUT 699 for output S (e.g., see FIG. 6C) and another LUT 698 for output Cout (e.g., see FIG. 6D). As illustrated, each LUT 699 and 698 can include a cross-bar router as described in detail above with two rows and eight columns (e.g., see the cross-bar routers 100A and 100B, respectively). Each LUT 699 and 698 can also include mode control circuitry to facilitate the different operation modes (i.e., program, erase, and switch). However, to avoid clutter in the drawings and allow the reader focus on the salient aspects of such LUTs, mode control circuitry is not depicted.

Figure 6C:
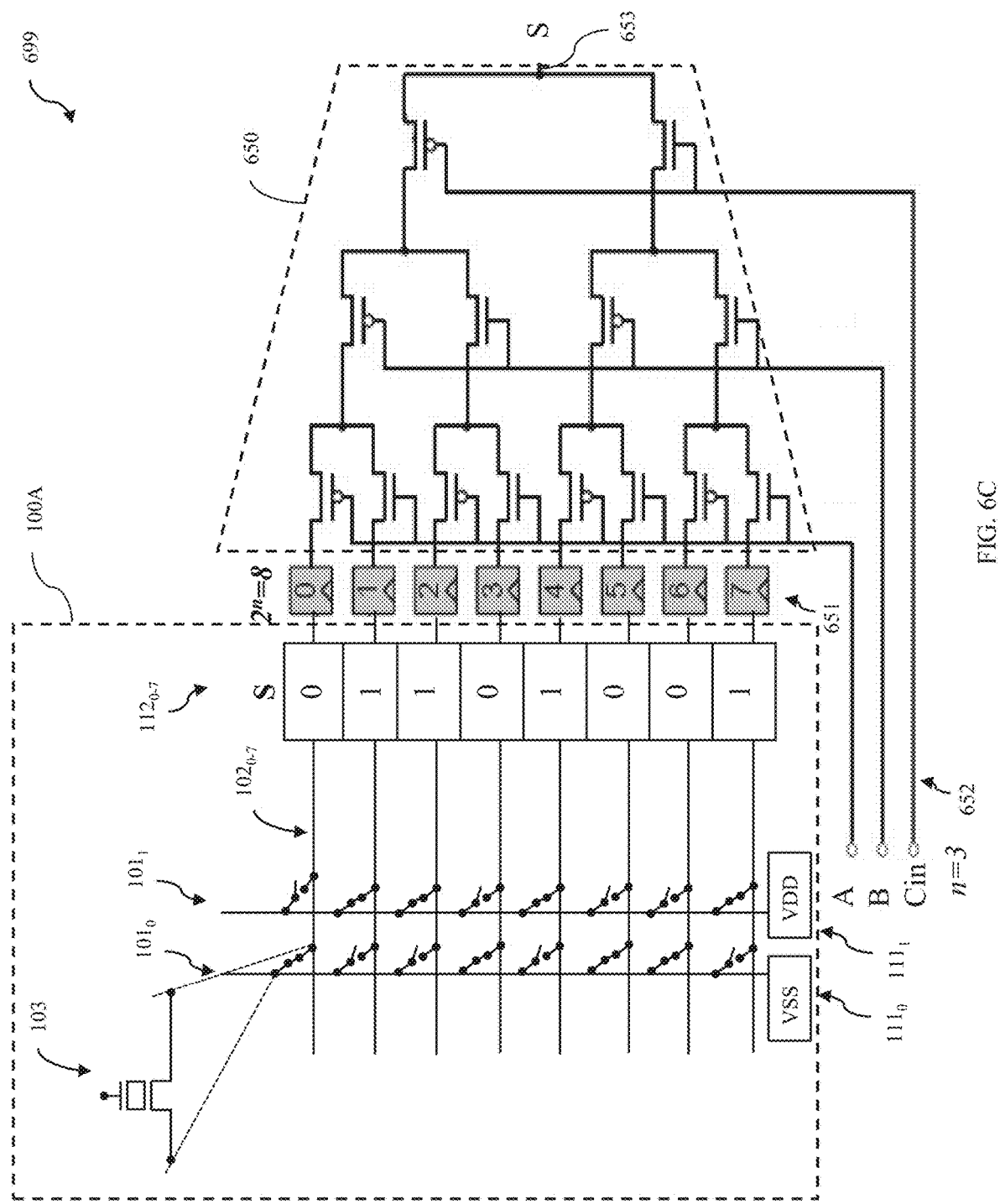
FIGS. 6C and 6D are schematic diagrams illustrating exemplary look-up tables (LUT) used to implement the full adder circuit function with each LUT incorporating a cross-bar router as disclosed herein.

Referring to FIG. 6C, the LUT 699 for output S can include a cross-bar router 100A, as described above, with an array of programmable transistors 103 arranged in two rows and eight columns. Each LUT 699 can further include an 8:1 multiplexing circuit 650. The 8:1 multiplexing circuit 650 can have eight data line inputs 651, three select line inputs 652, and an output 653. The cross-bar router 100A can have SL1s 101 for the rows and corresponding first input/output nodes 111 on the SL1s for receiving Vss and Vdd, respectively. The cross-bar router can further have SL2s 102 with corresponding second input/output nodes 112 connected to data line inputs 651 of the 8:1 multiplexing circuit 650. The programmable transistors 103 of the cross-bar router 100A can be selectively programmed or erased such that, during switch mode operation, a Vss signal or a Vdd signal is communicated to each second input/output node 112 and, thus, supplied to each data line input 651 of the 8:1 multiplexing circuit 650 corresponds to the specific output values for S, as shown in the truth table of FIG. 6B. The multiplexing circuit 650 can be configured to receive the Vss and Vdd signals at the eight data line inputs 651 and to further receive a specific combination of three select values on the three select line inputs 652. The specific combination of three select values can be the same as a specific combination of three input values to the combinational logic function, as indicated in the truth table of FIG. 6B. The multiplexing circuit 650 can further be configured to selectively output a specific output value (e.g., a 1 or a 0) to the multiplexing circuit output node 653, based on that specific combination of three select values.

Figure 6D:
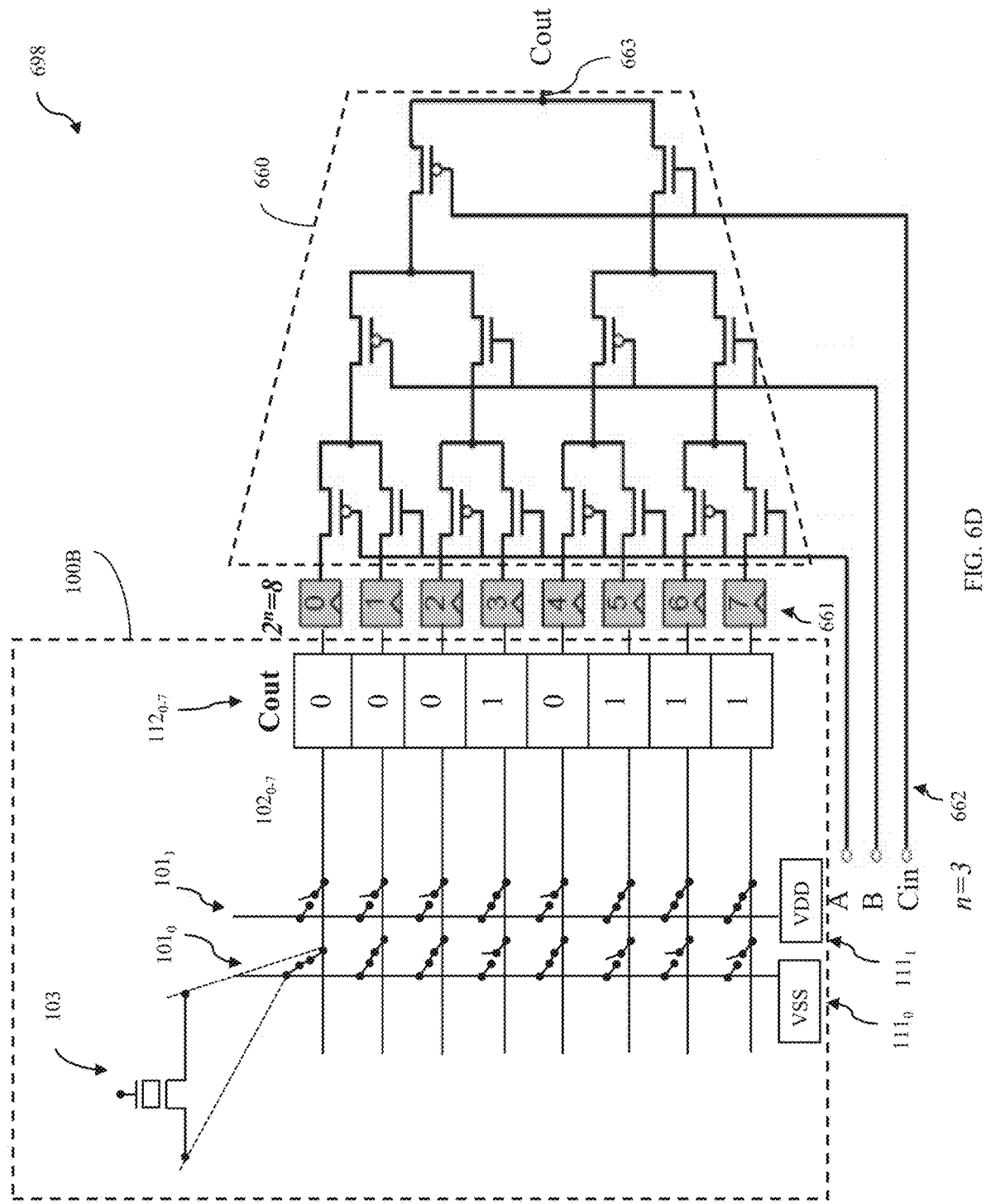

Similarly, referring to FIG. 6D, the LUT 698 for output Cout can include a cross-bar router 100B, as described above, with an array of programmable transistors 103 arranged in two rows and eight columns. Each LUT 698 can further include an 8:1 multiplexing circuit 660. The 8:1 multiplexing circuit 660 can have eight data line inputs 661, three select line inputs 662, and an output 663. The cross-bar router 100B can have SL1s 101 for the rows and corresponding first input/output nodes 111 on the SL1s for receiving Vss and Vdd, respectively. The cross-bar router can further have SL2s 102 with corresponding second input/output nodes 112 connected to data line inputs 661 of the 8:1 multiplexing circuit 660. The programmable transistors 103 of the cross-bar router 100B can be selectively programmed or erased such that, during switch mode operation, a Vss signal or a Vdd signal is communicated to each second input/output node 112 and, thus, supplied to each data line input 661 of the 8:1 multiplexing circuit 660 corresponds to the specific output values for Cout, as shown in the truth table of FIG. 6B. The multiplexing circuit 660 can be configured to receive the Vss and Vdd signals at the eight data line inputs 661 and to further receive a specific combination of three select values on the three select line inputs 662. The specific combination of three select values can be the same as a specific combination of three input values to the combinational logic function, as indicated in the truth table of FIG. 6B. The multiplexing circuit 660 can further be configured to selectively output a specific output value (e.g., a 1 or a 0) to the multiplexing circuit output node 663, based on that specific combination of three select values.

Figure 7:
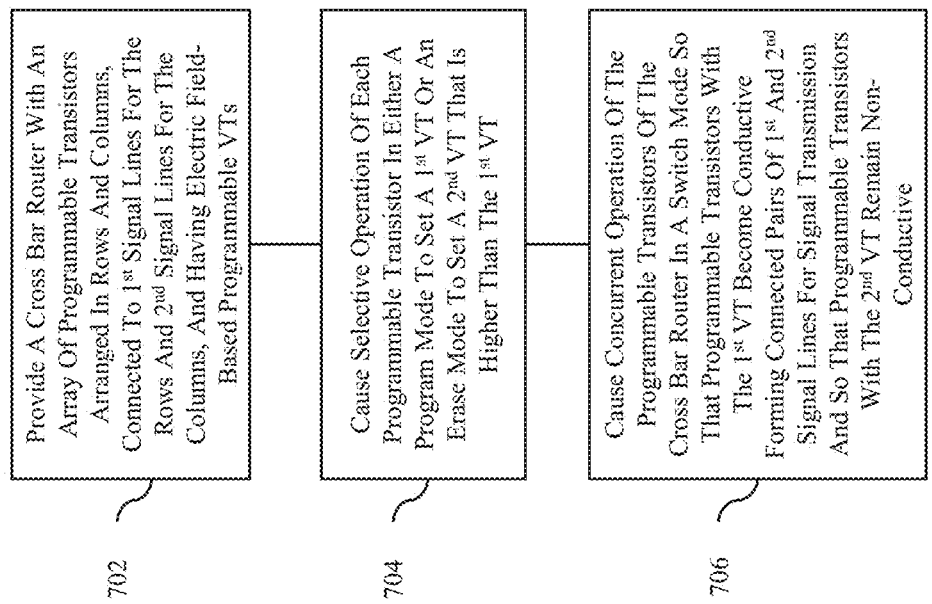
FIG. 7 is a flow diagram illustrating embodiments of a cross-bar router operating method.

Referring to the flow diagram of FIG. 7, also disclosed herein are method embodiments for operating the above-described structures. The method can include providing a structure, such as the structure 400 of FIG. 4A or 4B or some other suitable structure, that includes a cross-bar router 100 and mode control circuitry for the cross-bar router (see process 702). As discussed above, the cross-bar router 100 can include an array of programmable transistors 103. The programmable transistors 103 can be arranged in rows (R0-Rm) and columns (C0-Cn). The programmable transistors 103 can have electric field-based programmable threshold voltages. Thus, for example, the programmable transistors 103 can be FeFETs (as described above and illustrated in FIGS. 2A-2B), CTFETs (e.g., as described above and illustrated in FIGS. 3A-3B), or some other suitable type of programmable transistor with an electric field-based programmable threshold voltage. The programmable transistors 103 can further be connected to SL1s 101 for the rows and SL2s 102 for the columns. That is, each SL1 101 can be connected to first source/drain terminals 105 of all of the programmable transistors 103 in a corresponding row. Additionally, each SL2 102 can be connected to second source/drain terminals 106 of all of the programmable transistors 103 in a corresponding column.

The method can further include causing selective operation of each programmable transistor 103 in either a program mode or an erase mode (see process 704). The program mode sets the electric field-based programmable threshold voltage of the programmable transistor 103 at a first VT. The erase mode sets the electric field-base programmable threshold of the programmable transistor 103 at a second VT that is different from (e.g., higher than) the first VT. The method can further include causing concurrent operation of all of the programmable transistors 103 in a switch mode (see process 706). In the switch mode, any programmable transistor 103 having the first VT becomes conductive forming a connected pair of first and second signal lines 101-102 and any programmable transistor 103 having the second VT remains non-conductive. It should be noted that, in the switch mode, any connected pair of first and second signals 101-102 creates a signal path between a first input/output node 111 on the SL1 101 of the connected pair and a second input/output node 112 on the SL2 102 of the connected pair and the method further comprises, in the switch mode, enabling signal communication along signal paths created by the connected pairs of first and second signal lines.

For example, the method can include, at process 702, specifically providing a structure 400, as shown in FIG. 4A or 4B, including a cross-bar router 100 made up of an array of n-type FeFETs and mode control circuitry for operating the n-type FeFETs in program, erase and switch modes. Specifically, as discussed above in the structure 400, the mode control circuitry can include n-type access transistors 461 for the programmable transistors 103; GVLs 460 for the columns; and WLs 465 for the rows. Each access transistor 461 for each programmable transistor 103 in a given row and a given column has a gate terminal connected to the WL 465 for the given row and has source/drain terminals connected to the GVL 460 for the given column and to the gate terminal 104 of the programmable transistor 103.

The method can include establishing, by the mode control circuitry, different bias conditions on the WLs 465, the SL1s 101, the GVLs 460, and the SL2s 102 in different operation modes and depending on a row address and a column address of any programmable transistor operating in the program mode or the erase mode.

For example, at process 704, causing operation of any selected programmable transistor in a specific row and a specific column in the program mode can include: applying a program operation wordline voltage (which is at least equal to a sum of the positive program mode voltage pulse (Vp) and the access transistor VT (i.e., the VT of the access transistor) to a specific WL 465 for the specific row, applying Gnd to a specific SL1 for the specific row, establishing a HiZ state on all other WLs 465 and all other SL1s 101 for all other rows, applying Vp to a specific GVL 460 for the specific column, applying Gnd to a specific SL2 102 for the specific column, and establishing the HiZ state on all other GVLs 460 and all other SL2s for all other columns.

At process 704, causing operation of any selected programmable transistor in the specific row and the specific column can include: applying an erase operation wordline voltage (which is at least equal to the access transistor VT to the specific WL 465 for the specific row, applying a positive erase mode voltage pulse (Ve) to the specific SL1 101, establishing the HiZ state on all other WLs 465 and all other SL1s 101 for all other rows, applying Gnd to the GVL 460 for the specific column, applying Ve to the specific SL2 for the specific column, and establishing the HiZ state on all other GVLs 460 and all other SL2s for all other columns. It should be noted that, at process 704, multiple programmable transistors from the same column can be selected for concurrent program or erase operations and, in this case, the specific WL and the specific SL1 for each row containing a selected programmable transistor in the same column will be biased as described above and the HiZ state will be established on any remaining WLs and SL1s connected to any unselected programmable transistors in the same column. Similarly, at process 704, multiple programmable transistors from the same row can be selected for concurrent program or erase operations and, in this case, the specific GVL and the specific SL2 for each column containing a selected programmable transistor in the same row will be biased as described above and the HiZ state will be established on any remaining GVLs and SL2s connected to any unselected programmable transistors in the same row.

At process 706, causing concurrent operation of the programmable transistors 103 in the switch mode can include applying a switch operation wordline voltage (which is at least equal to the sum of a switch mode voltage pulse (Vsw) and the access transistor VT) to all of the WLs 465 for all of the rows, establishing the HiZ state on all of the SL1s 101 for all of the rows, applying Vsw to all of the GVLs 460 for all of the columns, and establishing the HiZ state on all of the SL2s 102 for all other columns.

In the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on.

Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   programmable transistors arranged in rows and columns, wherein each programmable transistor has an electric field-based programmable threshold voltage;
   first signal lines for the rows, wherein each first signal line is connected to first source/drain terminals of all of the programmable transistors in a corresponding row; and
   second signal lines for the columns, wherein each second signal line is connected to second source/drain terminals of all of the programmable transistors in a corresponding column.

2. The structure of claim 1, wherein the electric field-based programmable threshold voltage is one of a first threshold voltage and a second threshold voltage that is different from the first threshold voltage.

3. The structure of claim 2, wherein the programmable transistors are concurrently operable in a switch mode and wherein, in the switch mode, any programmable transistor having the first threshold voltage becomes conductive forming a connected pair of first and second signal lines and any programmable transistor having the second threshold voltage remains non-conductive.

4. The structure of claim 3, wherein the connected pair of first and second signal lines creates a signal path between a first input/output node on the first signal line of the connected pair and a second input/output node on a second signal line of the connected pair and wherein, in the switch mode, signal communication along signal paths created by connected pairs of first and second signal lines is enabled.

5. The structure of claim 3,
   wherein the programmable transistors are n-type field effect programmable transistors,
   wherein the second threshold voltage is higher than the first threshold voltage, and
   wherein, in the switch mode, gate terminals of the n-type field effect programmable transistors concurrently receive a positive switch mode voltage between the first threshold voltage and the second threshold voltage.

6. The structure of claim 1, wherein the programmable transistors comprise any of ferroelectric field effect transistors and charge trap field effect transistors.

7. A structure comprising:
   an array of programmable transistors arranged in rows and columns, wherein each programmable transistor has an electric field-based programmable threshold voltage;
   first signal lines for the rows, wherein each first signal line is connected to first source/drain terminals of all of the programmable transistors in a corresponding row; and
   second signal lines for the columns, wherein each second signal line is connected to second source/drain terminals of all of the programmable transistors in a corresponding column; and
   mode control circuitry connected to the array,
      wherein the mode control circuitry is configured to cause operation of each of the programmable transistors in one of a program mode to set a first threshold voltage and an erase mode to set a second threshold voltage that is higher than the first threshold voltage, and
      wherein the mode control circuitry is further configured to cause concurrent operation of all of the programmable transistors in a switch mode with any programmable transistor having the first threshold voltage becoming conductive to form a connected pair of first and second signal lines and with any programmable transistor having the second threshold voltage remaining non-conductive.

8. The structure of claim 7, wherein the connected pair of first and second signal lines creates a signal path between a first input/output node on the first signal line of the connected pair and a second input/output node on a second signal line of the connected pair and wherein, in the switch mode, signal communication along signal paths created by connected pairs of first and second signal lines is enabled.

9. The structure of claim 7, wherein the mode control circuitry comprises:
   access transistors for the programmable transistors;
   gate voltage lines for the columns; and
   wordlines for the rows, wherein each access transistor for each programmable transistor in a given row and a given column has a gate connected to a wordline for the given row and has source/drain terminals connected to a gate voltage line for the given column and to a gate terminal of the programmable transistor.

10. The structure of claim 9, wherein the mode control circuitry is configured to establish different bias conditions on the wordlines, the first signal lines, the gate voltage lines, and the second signal lines in different operation modes and depending on a row address and a column address of any programmable transistor operating in any of the program mode and the erase mode.

11. The structure of claim 10, wherein the mode control circuitry comprises tristate inverters connected to the wordlines, the first signal lines, the gate voltage lines, and the second signal lines to facilitate switching each line between any of ground, a positive voltage state, and a high impedance state and wherein at least the tristate inverters connected to the wordlines and the gate voltage lines have variable positive voltage supplies to facilitate switching between different positive voltage states depending on the different operation modes.

12. The structure of claim 10,
   wherein the programmable transistors comprise n-type ferroelectric field effect transistors,
   wherein the access transistors comprise n-type access transistors, and
   wherein the mode control circuitry comprises:
      a row control block connected to the wordlines and the first signal lines; and
      a column control block connected to the gate voltage lines and the second signal lines.

13. The structure of claim 12,
   wherein, in the program mode in a specific programmable transistor in a specific row and a specific column, the row control block applies a program operation wordline voltage at least equal to a sum of a program mode voltage and an access transistor threshold voltage to a specific wordline for the specific row, applies ground to a specific first signal line for the specific row, and establishes a high impedance state on all other wordlines and all other first signal lines for all other rows, and
   wherein, in the program mode in the specific programmable transistor in the specific row and the specific column, the column control block applies the program mode voltage to a specific gate voltage line for the specific column, applies ground to a specific second signal line for the specific column, and establishes the high impedance state on all other gate voltage lines and all other second signal lines for all other columns.

14. The structure of claim 12,
   wherein, in the erase mode in a specific programmable transistor in a specific row and a specific column, the row control block applies an erase operation wordline voltage at least equal to an access transistor threshold voltage to a specific wordline for the specific row, applies an erase mode voltage to a specific first signal line for the specific row, and establishes a high impedance state on all other wordlines and all other first signal lines for all other rows, and
   wherein, in the erase mode in the specific programmable transistor in the specific row and the specific column, the column control block applies ground to a specific gate voltage line for the specific column, applies the erase mode voltage to a specific second signal line for the specific column, and establishes the high impedance state on all other gate voltage lines and all other second signal lines for all other columns.

15. The structure of claim 12,
   wherein, in the switch mode, the row control block applies a switch operation wordline voltage at least equal to a sum of a switch mode voltage and an access transistor threshold voltage to all of the wordlines for all of the rows and establishes a high impedance state on all of the first signal lines for all of the rows, and
   wherein, in the switch mode, the column control block applies the switch mode voltage to all of the gate voltage lines for all of the columns and establishes the high impedance state on all of the second signal lines for all other columns.

16. A method comprising:
   causing, by mode control circuitry, each programmable transistor in an array of programmable transistors to operate in one of a program mode and an erase mode, wherein the program mode sets an electric field-based programmable threshold voltage of the programmable transistor at a first threshold voltage and wherein the erase mode sets the electric field-base programmable threshold of the programmable transistor at a second threshold voltage that is different from the first threshold voltage,
      wherein the programmable transistors are arranged in rows and columns and are connected to first signal lines for the rows and second signal lines for the columns,
      wherein each first signal line is connected to first source/drain terminals of all of the programmable transistors in a corresponding row, and
      wherein each second signal line is connected to second source/drain terminals of all of the programmable transistors in a corresponding column; and
   causing, by the mode control circuitry, the programmable transistors to concurrently operate in a switch mode, wherein, in the switch mode, any programmable transistor having the first threshold voltage becomes conductive forming a connected pair of first and second signal lines and any programmable transistor having the second threshold voltage remains non-conductive.

17. The method of claim 16, wherein the programmable transistors comprise any of ferroelectric field effect transistors and charge trap field effect transistors.

18. The method of claim 16, wherein the connected pair of first and second signal lines creates a signal path between a first input/output node on the first signal line of the connected pair and a second input/output node on a second signal line of the connected pair.

19. The method of claim 18, further comprising, in the switch mode, enabling signal communication along signal paths created by connected pairs of first and second signal lines.

20. The method of claim 19,
wherein the programmable transistors comprise n-type ferroelectric field effect transistors,
wherein the array is connected to mode control circuitry,
wherein the mode control circuitry comprises: n-type access transistors for the programmable transistors; gate voltage lines for the columns; and wordlines for the rows, wherein each access transistor for each programmable transistor in a given row and a given column has a gate terminal connected to a wordline for the given row and has source/drain terminals connected to a gate voltage line for the given column and to a gate terminal of the programmable transistor,
wherein the method further comprises establishing, by the mode control circuitry, different bias conditions on the wordlines, the first signal lines, the gate voltage lines, and the second signal lines in different operation modes and depending on a row address and a column address of any programmable transistor operating in any of the program mode and the erase mode, and
wherein the establishing of the different bias conditions comprises:
  in the program mode in a specific programmable transistor in a specific row and a specific column, applying a program operation wordline voltage at least equal to a sum of a program mode voltage and an access transistor threshold voltage to a specific wordline for the specific row, applying ground to a specific first signal line for the specific row, establishing a high impedance state on all other wordlines and all other first signal lines for all other rows, applying the program mode voltage to a specific gate voltage line for the specific column, applying ground to a specific second signal line for the specific column, and establishing the high impedance state on all other gate voltage lines and all other second signal lines for all other columns;
  in the erase mode in the specific programmable transistor in the specific row and the specific column, applying an erase operation wordline voltage at least equal to the access transistor threshold voltage to the specific wordline for the specific row, applying an erase mode voltage to the specific first signal line, establishing the high impedance state on all other wordlines and all other first signal lines for all other rows, applying ground to the specific gate voltage line for the specific column, applying the erase mode voltage to the specific second signal line for the specific column, and establishing the high impedance state on all other gate voltage lines and all other second signal lines for all other columns; and
  in the switch mode in all of the programmable transistors, applying a switch operation wordline voltage at least equal to a sum of a switch mode voltage and an access transistor threshold voltage to all of the wordlines for all of the rows, establishing the high impedance state on all of the first signal lines for all of the rows, applying the switch mode voltage to all of the gate voltage lines for all of the columns, and establishing the high impedance state on all of the second signal lines for all other columns.

* * * * *